United States Patent
Bouche et al.

(10) Patent No.: US 7,391,143 B2
(45) Date of Patent: Jun. 24, 2008

(54) SUPPORT AND DECOUPLING STRUCTURE FOR AN ACOUSTIC RESONATOR, ACOUSTIC RESONATOR AND CORRESPONDING INTEGRATED CIRCUIT

(75) Inventors: Guillaume Bouche, Grenoble (FR); Gregory Caruyer, Goncelin (FR); Pascal Ancey, Revel (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/731,942

(22) Filed: Apr. 2, 2007

(65) Prior Publication Data

US 2007/0182284 A1    Aug. 9, 2007

Related U.S. Application Data

(63) Continuation of application No. 10/868,383, filed on Jun. 15, 2004, now abandoned, which is a continuation-in-part of application No. PCT/FR03/03500, filed on Nov. 27, 2003.

(30) Foreign Application Priority Data

Nov. 28, 2002   (FR)   ................................. 02 14967

(51) Int. Cl.
*H01L 41/083* (2006.01)

(52) U.S. Cl. ...................................... 310/327

(58) Field of Classification Search ............. 310/327, 310/335, 348
See application file for complete search history.

(56) References Cited

U.S. PATENT DOCUMENTS

| 3,422,371 | A | 1/1969 | Poirier et al. |
| 4,651,411 | A | 3/1987 | Konaka et al. |
| 5,873,154 | A | 2/1999 | Ylilammi |
| 6,313,518 | B1 | 11/2001 | Ahn et al. |
| 6,445,254 | B1 * | 9/2002 | Shibuya et al. ............. 331/68 |
| 6,542,054 | B2 | 4/2003 | Aigner et al. |
| 6,670,866 | B2 | 12/2003 | Ella et al. |
| 6,720,844 | B1 | 4/2004 | Lakin |
| 6,744,090 | B2 | 6/2004 | Kim |

(Continued)

FOREIGN PATENT DOCUMENTS

EP    1158671    11/2001

(Continued)

OTHER PUBLICATIONS

International Search Report, PCT/FR03/03500, dated May 19, 2004.

(Continued)

*Primary Examiner*—Darren Schuberg
*Assistant Examiner*—Derek J Rosenau
(74) *Attorney, Agent, or Firm*—Gardere Wynne Sewell LLP

(57) ABSTRACT

An acoustic resonator assembly includes a layer of high-acoustic-impedance material and a layer of low-acoustic-impedance material made of a low-electrical-permittivity material. This assembly may support the resonator over an interconnect layer or act as a decoupling assembly between two active elements of the resonator. The assembly may alternatively include three low-acoustic impedance layers. Alternatively, the assembly may include three acoustic impedance layers wherein two of the layers are low acoustic impedance layers and the third layer has a higher acoustic impedance than the first two or alternatively is a high-acoustic impedance layer.

37 Claims, 3 Drawing Sheets

U.S. PATENT DOCUMENTS

| | | | |
|---|---|---|---|
| 2001/0028285 | A1 | 10/2001 | Klee et al. |
| 2002/0093398 | A1 | 7/2002 | Ella et al. |
| 2002/0172766 | A1 | 11/2002 | Laxman |
| 2004/0124952 | A1 | 7/2004 | Tikka |
| 2004/0253828 | A1 | 12/2004 | Ozawa et al. |
| 2005/0023931 | A1 | 2/2005 | Bouche et al. |
| 2005/0023932 | A1 | 2/2005 | Inoue et al. |
| 2005/0093399 | A1 | 5/2005 | Inoue |
| 2005/0168104 | A1 | 8/2005 | Bouche et al. |
| 2007/0152777 | A1 | 7/2007 | Bouche et al. |

FOREIGN PATENT DOCUMENTS

| | | |
|---|---|---|
| JP | 02 101617 | 4/1990 |
| JP | 9 275323 | 10/1997 |
| JP | 2000353702 | 12/2000 |
| WO | WO-2004051848 A1 | 6/2004 |

OTHER PUBLICATIONS

Patent Abstracts of Japan, vol. 2003, No. 12, Dec. 5, 2003; and JP 2004 187204 A, Sony Corp., Jul. 2, 2004.

Elbrecht., et al., "Integration of Bulk Acoustic Wave Filters: Concepts and Trends," Microwave Symposium Digest, 2004 IEEE MTT-S International, Fort Worth, TX, USA, Jun. 6-11, 2004, Piscataway, NJ, USA, IEEE, Jun. 6, 2004, pp. 395-398; XP010727323; ISBN: -7803-8331-1.

Dubois, et al., "Integration of High-Q BAW Resonators and Filters Above IC," 2005 IEEE International Sold-State Circuit Conference, ISSCC 2005, Session 21, TD: RF Trends Above-IC Integration and MM-Wave, 21.2; 0-7803-8904-2.

* cited by examiner

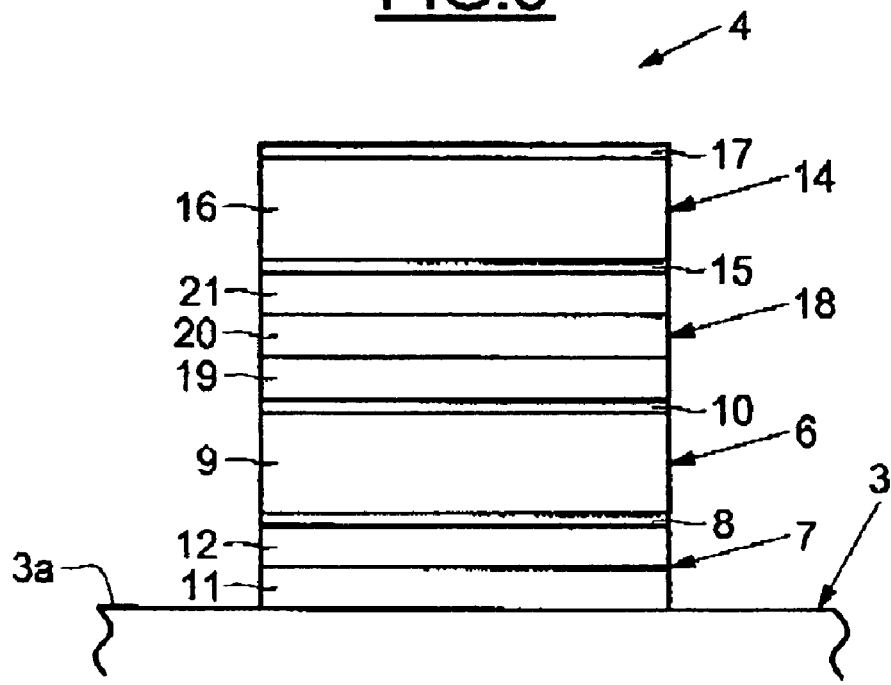
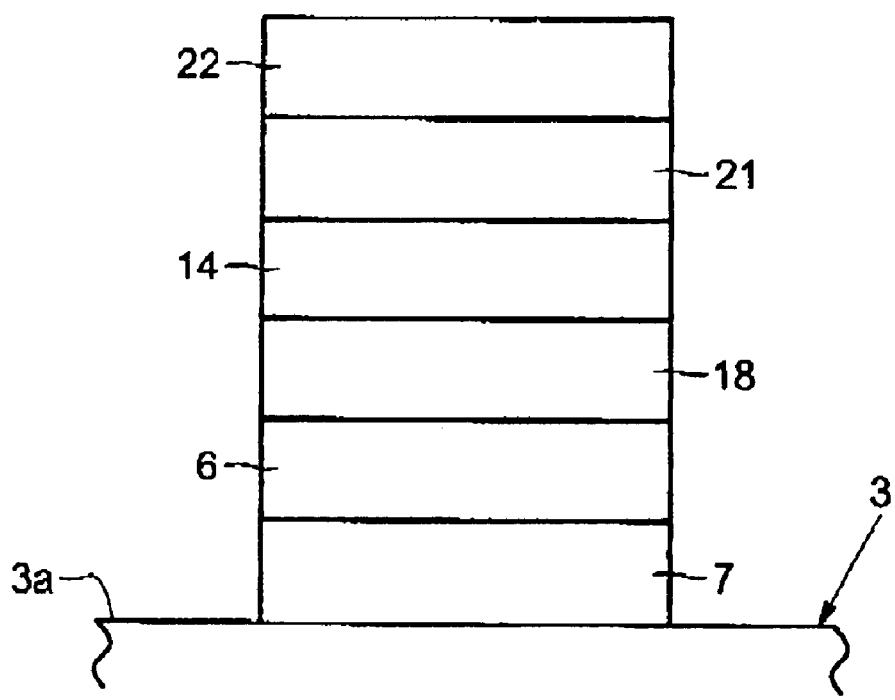

SUPPORT AND DECOUPLING STRUCTURE FOR AN ACOUSTIC RESONATOR, ACOUSTIC RESONATOR AND CORRESPONDING INTEGRATED CIRCUIT

CROSS-REFERENCE TO RELATED APPLICATIONS AND PRIORITY CLAIM

The present application is a continuation of United States Application for patent Ser. No. 10/868,383 filed Jun. 15, 2004 now abandoned, which is a continuation-in-part (CIP) of PCT Application No. PCT/FR03/03500, filed Nov. 27, 2003, which claims priority from French Application for Patent No. 02 14967 filed Nov. 28, 2002, the disclosures of which are hereby incorporated by reference.

BACKGROUND OF THE INVENTION

1. Technical Field of the Invention

The present invention relates to the field of integrated circuits, and more particularly to integrated circuits comprising one or more acoustic or piezoelectric resonators. Such circuits can be used in signal processing applications, for example, for performing a filtering function.

2. Description of Related Art

Acoustic resonators are integral with the integrated circuit, while having to be acoustically or mechanically isolated therefrom. For this purpose, a support capable of producing such isolation may be provided. The support may comprise an alternation of a layer having a high acoustic impedance and a layer having a low acoustic impedance (see, U.S. Pat. No. 6,081,171, the disclosure of which is hereby incorporated by reference).

The term "acoustic impedance" is understood to mean the quantity Z given by the density $\rho$ of the material multiplied by the acoustic velocity v, i.e., $Z=\rho v$. The acoustic velocity v may be taken as being defined by:

$$v=(\rho C_{33})^{1/2}$$

where $C_{33}$ is one of the coefficients of the elastic compliance matrix.

For high acoustic isolation performance, it is desirable for the difference in acoustic impedance between the materials to be as high as possible.

A need exists in the art to meet this requirement.

SUMMARY OF THE INVENTION

A support/decoupling structure is proposed for an acoustic resonator, providing a high level of acoustic isolation.

The support/decoupling structure for an acoustic resonator, according to one embodiment, comprises at least one assembly comprising a layer of high-acoustic-impedance material and a layer of low-acoustic-impedance material made of a low-electrical-permittivity material. It appears in fact that low electrical permittivity goes hand in hand with low acoustic impedance. In such a material, an acoustic wave propagates slowly.

In one embodiment for decoupling structure between to active elements, the layer of low-acoustic-impedance material is placed between one active element and the layer of high-acoustic-impedance material.

In one embodiment, the layer of high-acoustic-impedance material is an upper electrode of said another resonator.

Advantageously, the relative electrical permittivity of the low-acoustic-impedance material is less than 4, preferably less than 3 and better still less than 2.5.

Advantageously, the layer of low-acoustic-impedance material is produced from one of the materials used for fabricating the rest of the circuit of which it forms a part, for example, for fabricating the interconnect levels.

In one embodiment, the low-acoustic-impedance material comprises SiOC. SiOC is a material used sometimes for producing dielectric layers having a very low permittivity on a substrate or in the interconnects. Preferably, porous SiOC may be used, the acoustic impedance of which is even lower. The pores of such a material are generally filled with a gas, such as argon.

In one embodiment, the high-acoustic-impedance material comprises at least one of the following species: aluminum, copper, nickel, gold, platinum, molybdenum. Copper has an acoustic impedance lower than that of tungsten, but is beneficial as it is often used in the interconnects of the circuit. A copper layer on the support may thus be produced during a common step for fabricating interconnects.

In one embodiment, the layer of low-acoustic-impedance material has a thickness of between 0.3 and 0.7 µm.

An acoustic resonator is proposed comprising at least two active elements and a decoupling assembly. The decoupling assembly comprises at least a layer of low-acoustic-impedance material made of a low-electrical-permittivity material placed between the active elements.

In one embodiment, an active element comprises at least one piezoelectric layer placed between two electrodes. A lower electrode of an upper active element may rest on the decoupling assembly. The decoupling assembly may rest on an upper electrode of a lower active element. The piezoelectric layer may be made of crystalline aluminum nitride. The decoupling assembly acts as interface between two active elements.

Advantageously, the decoupling assembly comprises no more than one layer of low-acoustic-impedance material.

Advantageously, the decoupling assembly comprises two layers of low-acoustic-impedance material.

Advantageously, the decoupling assembly comprises three layers of low-acoustic-impedance material.

An integrated circuit is also proposed comprising a substrate, a set of interconnects and an acoustic resonator that is provided with at least two active elements and with a decoupling assembly. The support of the acoustic resonator may include at least one bilayer assembly comprising a layer of high-acoustic-impedance material and a layer of low-acoustic-impedance material made of a low-electrical-permittivity material.

In one embodiment, the acoustic resonator is placed on the set of interconnects, for example being supported by an upper dielectric layer of the set of interconnects.

In another embodiment, the acoustic resonator is placed near the set of interconnects, the upper electrode of the upper active element of the acoustic resonator possibly being flush with the upper surface of the set of interconnects.

Advantageously, at least one material is common between the support and the substrate or the set of interconnects. Copper may serve both as the layer of high-acoustic-impedance material of the support and for the metallization lines of the set of interconnects. Preferably, a common fabrication step will be provided both for the said layer of high-acoustic-impedance material of the support and the metallization levels of the set of interconnects.

A layer of low-acoustic-impedance material may be placed at the same level as an interconnect layer.

BRIEF DESCRIPTION OF THE DRAWINGS

A more complete understanding of the method and apparatus may be acquired by reference to the following Detailed Description when taken in conjunction with the accompanying Drawings wherein:

FIG. 5 is a schematic view of an acoustic resonator according to one aspect of the invention; and FIG. 6 is a schematic view of an acoustic resonator according to one aspect of the invention.

DETAILED DESCRIPTION OF THE DRAWINGS

Figure 1:
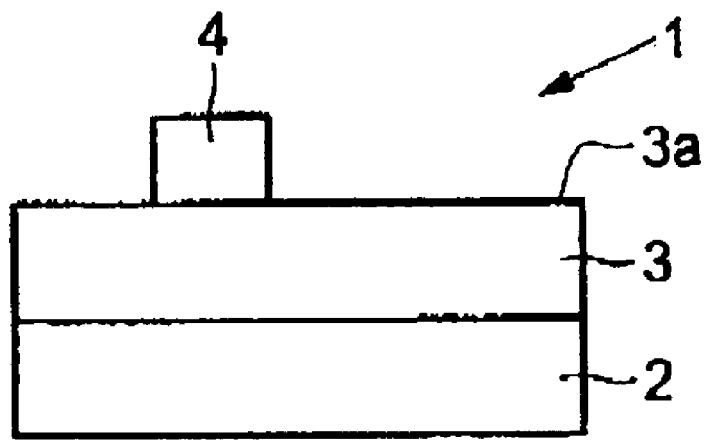
FIG. 1 is a schematic view of an integrated circuit according to a first embodiment of the invention.

As may be seen in FIG. 1, an integrated circuit 1 comprises a substrate 2, in which active zones (not shown) are generally formed, and a set of interconnects 3 placed above the substrate 2 and in contact with its upper surface, provided with at least one metallization level allowing interconnects to be made between the elements of the substrate.

The integrated circuit 1 is completed by a mechanical acoustic resonator 4 placed above the set of interconnects 3 in contact with its upper surface 3a. The mechanical acoustic resonator 4 supported by the set of interconnects 3 will also be provided with electrical connections (not shown).

Figure 2:
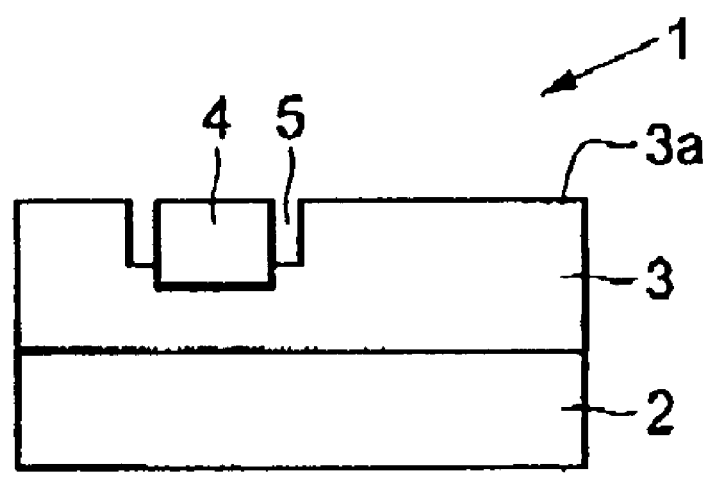
FIG. 2 is a schematic view of an integrated circuit according to a second embodiment of the invention.

In the embodiment illustrated in FIG. 2, the acoustic resonator 4 is placed within the set of interconnects 3 and is flush with its upper surface 3a. This construction makes the integrated circuit 1 more compact. A lower portion of the acoustic resonator 4 may be embodied in the set of interconnects 3, while an upper portion will be left free so as to be able to vibrate, being separated from the rest of the set of interconnects 3 via a groove 5. The groove 5 ensures that the component is isolated in the lateral directions, that is to say it allows the layers to vibrate without direct interference with the substrate. The thickness of the groove 5 may be small, for example less than 1 µm.

Figure 3:
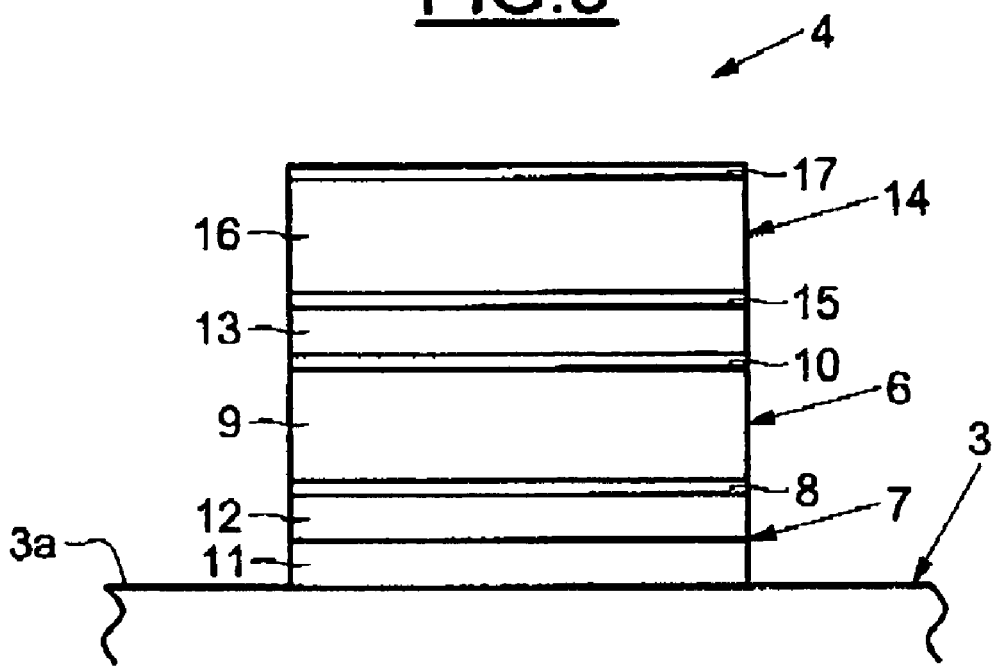
FIG. 3 is a schematic view of an acoustic resonator according to one aspect of the invention.

The structure of the acoustic resonator 4 will be described in greater detail with reference to FIG. 3.

The acoustic resonator 4 comprises an active element 6, a support 7 that rests on the upper surface 3a of the set of interconnects 3 and supports the active elements 6, a decoupling layer 13 that rests on the upper surface of the active element 6 and a supplementary active element 14 that rests on the upper surface of the decoupling layer 13.

The active element 6 comprises three main layers in the form of a lower electrode 8, a piezoelectric layer 9 and an upper electrode 10. The supplementary active element 14 comprises three main layers in the form of a lower electrode 15, a piezoelectric layer 16 and an upper electrode 17. The electrodes 8, 10, 15 and 17 are electrically connected (not shown) to conductors provided in the set of interconnects 3. The electrodes 8, 10, 15 and 17 are made of conducting material, for example aluminum, copper, platinum, molybdenum, nickel, titanium, niobium, silver, gold, tantalum, lanthanum, etc. The piezoelectric layers 9 and 16 placed between the electrodes 8 and 10, 15 and 17 may be made, for example, of crystalline aluminum nitride, zinc oxide, zinc sulfide, a ceramic of the LiTaO, PbTiO, PbZrTi, $KNbO_3$ type, or else a ceramic containing lanthanum, etc.

The piezoelectric layers 9 and 16 may have a thickness of a few µm, for example, 2.4 µm. The electrodes 8, 10, 15 and 17 may have a thickness substantially smaller than the piezoelectric layers 9 and 16, for example, 0.1 µm.

The decoupling layer 13 consists of a single layer made of low-acoustic-impedance material. In one embodiment of the invention, the material of low-acoustic-impedance has a low electric impedance, for example a material containing SiOC. SiOC or porous SiOC may be used.

The support 7 comprises a high-acoustic-impedance layer 11 resting on the upper surface 3a of the set of interconnects 3 and a low-acoustic-impedance layer 12 that supports the lower electrode 8 of the active element 6.

The high-acoustic-impedance layer 11 may be made of a dense material, such as amorphous aluminum nitride, copper, nickel, tungsten, gold or molybdenum. Alloys or superpositions of sublayers of these species may be envisaged. Tungsten offers an extremely high acoustic impedance and may be obtained so as to avoid the residual fabrication constraints, especially in a xenon environment, for example, by a xenon plasma. Copper offers less favorable acoustic impedance characteristics than tungsten, but has the advantage of often being used in the sets of interconnects for forming the conducting lines. Its use in the high-acoustic-impedance layer 11 may allow the said layer 11 to be produced by the same fabrication step as that for the conducting line of the set of interconnects, which is particularly economic.

The low-acoustic-impedance layer 12 is made of a material having a low electrical permittivity, because of the correspondence between low electrical permittivity and low acoustic impedance. The permittivity of the material of the layer 12 is less than 4. However, it will be preferred to use a material having a permittivity of less than 3, for example, a dielectric having a permittivity of around 2.9, often used as dielectric layer in the active zones of the substrate or in the set of interconnects 3. Here again, the same fabrication step may be used to form the layer 12 and a dielectric layer of the set of interconnects 3. For example, SiOC or SiOC-based material may be used. It is even more advantageous to make the layer 12 from a material having an ultralow permittivity of less than 2.5, for example around 2.0. For this purpose, the layer 12 may be made of porous SiOC or may be based on such a material. The pores of the porous SiOC may contain argon.

It will be understood that it is particularly advantageous from an economic standpoint to produce the support 7 from chemical species used for the fabrication of the set of interconnects. It is then possible to profit from the fabrication steps for the said set of interconnects in order to produce the support 7. This therefore avoids additional steps and a longer fabrication process.

Since the low-acoustic-impedance material of the layer 12 offers a very large acoustic impedance difference relative to that of the layer 11, the acoustic and/or mechanical isolation provided by the layer 7 between the active element 6 and the rest of the integrated circuit is improved. As a result, it is possible to reduce the number of pairs of layers 11 and 12 of the layer 7 for the same isolation characteristics. Thus, an application conventionally requiring three or four pairs of layers may be produced with only one or two pairs of layers 11 and 12, hence making the acoustic resonator more compact and reducing the costs. FIG. 3 shows a support 7 with one pair of layers 11 and 12. However, it is possible to provide a support 7 with two superposed pairs of layers 11 and 12, or even three or more pairs of layers 11 and 12, which then gives acoustic isolation characteristics of very high level.

It should be noted that a reflector may comprise an odd number of layers if a first layer of low acoustic impedance is placed under one or more bilayers.

The thickness of the low-acoustic-impedance layer 12 depends on the resonant frequency of the active element 6 and could advantageously be around one quarter of the wavelength. The layer 12 may have a thickness of the order of a few tenths of a micron, preferably less than 0.7 µm, for example from 0.2 µm to 0.7 µm. The thickness of the high-acoustic-impedance layer 11 may be the order of a few tenths of a micron, for example 0.3 µm to 3.2 µm.

The low-acoustic-impedance material of the decoupling layer 13 offers a very large acoustic impedance difference relative to that of the electrodes 10 and 15 comprising a high-acoustic-impedance material. A good acoustic isolation between the active elements 6 and 14 is obtained.

The invention therefore offers a support for an acoustic resonator having a very high acoustic impedance of between $30 \times 10^{-6}$ and $130 \times 10^{-6}$ kg/m$^2$.s. It is thus possible to benefit from an acoustic resonator, and from an integrated circuit, that is more compact and more economic because of the reduction in the number of layers.

Figure 4:
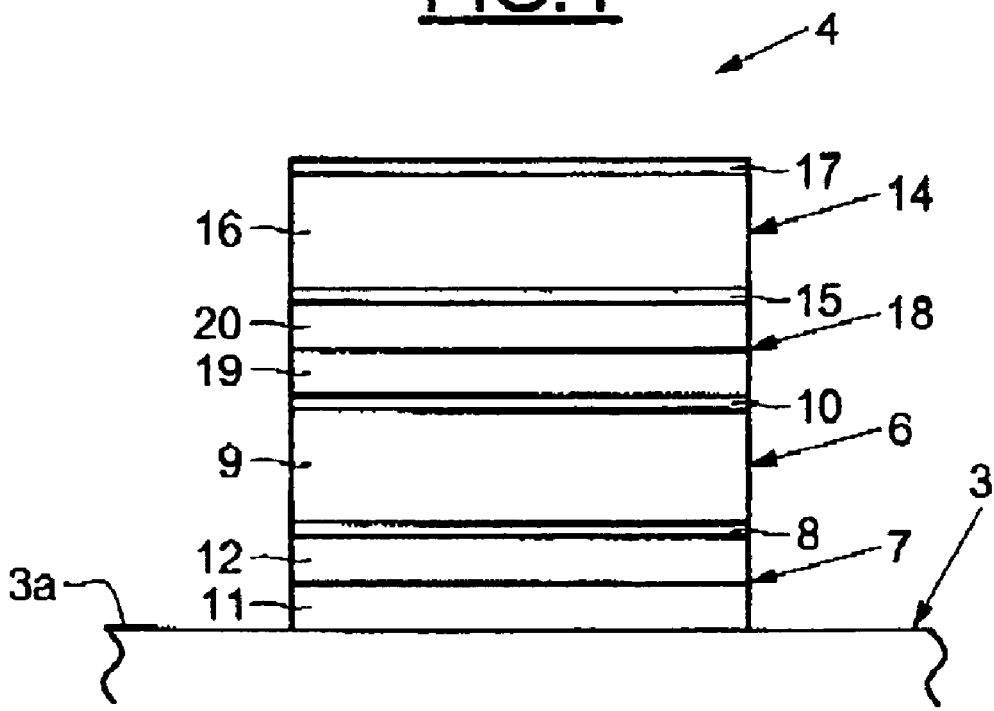
FIG. 4 is a schematic view of an acoustic resonator according to one aspect of the invention.

In the embodiment illustrated in FIG. 4, the decoupling layer 13 is replaced by a decoupling assembly 18 placed between the upper electrode 10 of the lower active element 6 and the lower electrode 15 of the supplementary active element 14. The decoupling assembly 18 comprises two layers 19 and 20 of low-acoustic-impedance material. The acoustic impedance of the layers 19 and 20 are different so as to obtain an improved decoupling effect. The low-acoustic-impedance layers 19 and 20 may both comprise SiOC material. For example, the low-acoustic-impedance layer 19 consists of porous SiOC comprising argon and the low-acoustic-impedance layer 20 comprises non-porous SiOC or a non-porous SiOC-based material having an acoustic impedance higher than the acoustic impedance of the layer 19. The decoupling assembly 18 provides an improved acoustic decoupling between the active element 6 and the supplementary active element 14.

In the embodiment of FIG. 5, the decoupling assembly 18 comprises a supplementary upper layer 21 placed between the layer 20 and the lower electrode 15 of the supplementary active element 14. At least one of the layers 19, 20 and 21 has an acoustic impedance different from the acoustic impedance of the two other layers. For example, the layers 19 and 21 are made of ultralow acoustic impedance material. It is advantageous to make the layers 19 and 21 of porous SiOC or of porous SiOC-based material. The layer 20 has an acoustic impedance greater than the acoustic impedance of the layers 19 and 21. For example, the layer 20 comprises non-porous SiOC or non-porous SiOC-based material.

In another example, the layer 20 is made of high acoustic impedance material, such as the material used for an electrode of an active element or the high-acoustic-impedance material of the layer 11 of the support 7. The layers 19 and 21 may be made of the same ultralow acoustic impedance material or may be made one of an ultralow acoustic impedance material and the other of a low-acoustic impedance material.

The invention therefore offers a stack of resonators acoustically separated by decoupling layers or assemblies. Consequently, the acoustic resonators are particularly compact and economic.

In the embodiment of FIG. 6, the acoustic resonator comprises three active elements 6, 14 and 22, a support 7 and two decoupling assemblies 18 and 21. The active element 6 rests on the support 7. The decoupling assembly 18 is placed between the active elements 6 and 14. The decoupling assembly 21 is placed between the active elements 14 and 22. The decoupling assembly 21 may be similar to the decoupling assembly 18. The active element 22 may be similar to the active elements 6 and 14. An acoustic resonator comprising three active elements is compact while having high decoupling properties between the active elements.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A structure, comprising:
   a substrate;
   an interconnect layer above the substrate;
   an acoustic resonator structure including a bottom portion embodied in the interconnect layer, the acoustic resonator structure including a decoupling structure positioned between first and second acoustic resonators, comprising:
      a layer of high-acoustic-impedance material; and
      a layer of low-acoustic-impedance SiOC material having a low-electrical-permittivity, wherein the low-acoustic-impedance SiOC material is a porous SiOC material including pores filled with Argon.

2. The structure according to claim 1, wherein the layer of low-acoustic-impedance SiOC material is placed between one of the two acoustic resonators and said layer of high-acoustic-impedance material.

3. The structure according to claim 1, wherein the layer of high-acoustic-impedance material is made of a same material as an electrode of one of the acoustic resonators.

4. The structure according to claim 1, wherein the layer of low-acoustic-impedance SiOC material comprises a plurality of sublayers comprising SiOC.

5. The structure according to claim 1, wherein the high-acoustic-impedance material comprises at least one material selected in the group consisting of: aluminum, copper, nickel, gold, platinum, molybdenum.

6. An acoustic resonator, comprising:
   a substrate;
   an interconnect layer above the substrate and including an opening with side walls;
   at least two active elements;
   a support layer between a first of the active elements and the interconnect layer, the support layer positioned within the opening and embodied in the interconnect layer, the two active elements separated by a groove from the side walls of the opening; and
   a decoupling assembly placed between the two active elements comprising at least a layer of low-acoustic-impedance material made of a low-electrical-permittivity material;
   wherein the low-acoustic-impedance material comprises a porous SiOC material including pores filled with Argon.

7. The resonator according to claim 6, wherein an active element comprises at least one piezoelectric layer placed between electrodes.

8. The resonator according to claim 6, wherein the decoupling assembly is placed between an upper electrode of a first active element and a lower electrode of a second active element.

9. The resonator according to claim 6, wherein an electrode comprises at least one material selected from the group consisting of: aluminum, copper, nickel, gold, platinum, molybdenum.

10. The resonator according to claim 6, wherein the decoupling assembly comprises no more than one layer of low-acoustic-impedance material.

11. The resonator according to claim 6, wherein the decoupling assembly comprises two layers of low-acoustic-impedance material.

12. The resonator according to claim 6, wherein the decoupling assembly comprises three layers of low-acoustic-impedance material.

13. An integrated circuit, comprising:
a substrate;
a set of interconnects in an interconnect layer, wherein the interconnect layer includes an opening formed in a top surface thereof having side walls; and
an acoustic resonator positioned at least partially within the opening in the top surface of the interconnect layer that is provided with at least two active elements and with a decoupling layer positioned between each pair of active elements, the active elements being separated from the side walls of the opening in the interconnect layer,
wherein the acoustic resonator comprises a support on the interconnect layer, the support including at least one bilayer assembly comprising a layer of high-acoustic-impedance material and a layer of low-acoustic-impedance material made of a low-electrical-permittivity material,
wherein the low-acoustic-impedance material comprises a porous SiOC material including pores filled with Argon.

14. The circuit according to claim 13, wherein a bottom portion of the acoustic resonator supporting a first of the active elements is placed on the set of interconnects.

15. The circuit according to claim 13, wherein a bottom portion of the acoustic resonator supporting a first of the active elements is embodied in the set of interconnects.

16. The circuit according to claim 13, wherein the decoupling layer comprises at least a layer of low-acoustic-impedance material.

17. The circuit according to claim 13, wherein the high-acoustic-impedance material comprises at least one material selected in the group consisting of: aluminum nitride, copper, nickel, tungsten, gold, platinum, molybdenum.

18. The circuit of claim 13, the decoupling layer, comprising:
at least one assembly positioned between a first and second acoustic resonators, comprising:
a first layer of low-acoustic-impedance material having a first acoustic impedance; and
a second layer of low-acoustic-impedance material having a second acoustic impedance.

19. The circuit according to claim 18, wherein the first layer of low-acoustic-impedance material comprises a layer of SiOC.

20. The circuit according to claim 19, wherein the first layer of low-acoustic-impedance material comprises a layer at least 90% SiOC in weight.

21. The circuit according to claim 19, wherein the second layer of low-acoustic-impedance material comprises a layer of porous SiOC including pores filled with Argon.

22. The circuit of claim 13, the decoupling layer, comprising:
at least one assembly positioned between a first and second acoustic resonators, comprising:
a first and second layers of low-acoustic-impedance material having a first acoustic impedance;
a third layer of low-acoustic-impedance material having a second acoustic impedance.

23. The circuit according to claim 22, wherein at least one of the layers of low-acoustic-impedance material comprises a layer of SiOC.

24. The circuit according to claim 23, wherein the at least one layer of low-acoustic-impedance material comprises a layer at least 90% SiOC in weight.

25. The circuit according to claim 23, wherein at least one other layer of low-acoustic-impedance material comprises a layer of porous SiOC including pores filled with Argon.

26. The circuit according to claim 22, wherein the third layer is a middle layer between the first and second layers.

27. The circuit according to claim 26, wherein the second acoustic impedance is higher than the first acoustic impedance.

28. The circuit of claim 13, the decoupling layer, comprising:
at least one assembly positioned between a first and second acoustic resonators, comprising:
a first layer of low-acoustic-impedance material having a first acoustic impedance;
a second layer of low-acoustic-impedance material having a second acoustic impedance;
a layer of high-acoustic-impedance material.

29. The circuit according to claim 28, wherein at least one of the first and second layers of low-acoustic-impedance material comprises a layer of SiOC.

30. The circuit according to claim 29, wherein the at least one layer of low-acoustic-impedance material comprises a layer at least 90% SiOC in weight.

31. The circuit according to claim 29, wherein the other of the first and second layers of low-acoustic-impedance material comprises a layer of porous SiOC including pores filled with Argon.

32. The circuit according to claim 28, wherein the third layer is a middle layer between the first and second layers.

33. The circuit according to claim 28, wherein the second acoustic impedance is higher than the first acoustic impedance.

34. The circuit according to claim 28, wherein the first and second acoustic impedances are the same.

35. An acoustic resonator, comprising:
a substrate;
an interconnect layer above the substrate;
a first, second and third active elements;
a support positioned under the first active element comprising a first high acoustic impedance layer and a first low acoustic impedance layer, the support being embodied in the interconnect layer and the low acoustic impedance layer comprising a porous SiOC material having pores filled with Argon;
a first decoupling assembly positioned between the first and second active elements comprising plural layers of acoustic-impedance material; and a second decoupling assembly positioned between the second and third active elements comprising plural layers of acoustic-impedance material.

36. The resonator of claim 35 wherein at least one of the first and second decoupling assemblies comprises:
- a first layer of low-acoustic-impedance material having a first acoustic impedance; and
- a second layer of low-acoustic-impedance material having a second acoustic impedance.

37. The resonator of claim 35 wherein at least one of the first and second decoupling assemblies comprises:
- a first layer of low-acoustic-impedance material having a first acoustic impedance;
- a second layer of low-acoustic-impedance material having a second acoustic impedance; and
- a layer of high-acoustic-impedance material.

* * * * *